(12) United States Patent
Ta et al.

(10) Patent No.: US 11,265,500 B2
(45) Date of Patent: Mar. 1, 2022

(54) PHOTODETECTION APPARATUS, ELECTRONIC APPARATUS AND PHOTODETECTION METHOD

(71) Applicant: KABUSHIKI KAISHA TOSHIBA, Minato-ku (JP)

(72) Inventors: Tuan Thanh Ta, Kawasaki (JP); Akihide Sai, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 30 days.

(21) Appl. No.: 16/813,858

(22) Filed: Mar. 10, 2020

(65) Prior Publication Data

US 2020/0396410 A1 Dec. 17, 2020

(30) Foreign Application Priority Data

Jun. 11, 2019 (JP) .............................. JP2019-108851

(51) Int. Cl.
| | | |
|---|---|---|
| *H04N 5/3745* | (2011.01) | |
| *H01L 31/107* | (2006.01) | |
| *H04N 5/374* | (2011.01) | |
| *H04N 5/378* | (2011.01) | |
| *H01L 27/146* | (2006.01) | |
| *H01L 31/02* | (2006.01) | |
| *G01J 1/42* | (2006.01) | |

(52) U.S. Cl.
CPC ... *H04N 5/37455* (2013.01); *H01L 27/14643* (2013.01); *H01L 31/107* (2013.01); *H04N 5/378* (2013.01); *H04N 5/3741* (2013.01)

(58) Field of Classification Search
CPC .. H04N 5/37455; H04N 5/3741; H04N 5/378; H04N 5/3745; H04N 5/363; H01L 31/107; H01L 27/14643; H01L 31/02027; G01J 1/42
See application file for complete search history.

(56) References Cited

U.S. PATENT DOCUMENTS

| | | |
|---|---|---|
| 7,262,402 B2 | 8/2007 | Niclass et al. |
| 7,858,917 B2 | 12/2010 | Stern et al. |
| 7,897,906 B2 | 3/2011 | Deschamps |
| 8,410,416 B2 | 4/2013 | Eldesouki et al. |
| 8,859,944 B2 | 10/2014 | Eldesouki et al. |

(Continued)

FOREIGN PATENT DOCUMENTS

| | | |
|---|---|---|
| EP | 3 419 168 A1 | 12/2018 |
| EP | 3 570 534 A1 | 11/2019 |

(Continued)

*Primary Examiner* — Albert H Cutler
(74) *Attorney, Agent, or Firm* — Oblon, McClelland, Maier & Neustadt, L.L.P.

(57) ABSTRACT

A photodetection apparatus according to one embodiment has a photodetection element, first reset circuitry configured to select whether to set on-resistance between a first voltage node and a terminal of the photodetection element to a first value, second reset circuitry configured to select whether to set the on-resistance to a second value smaller than the first value, and control circuitry configured to set the on-resistance to the first value by the first reset circuitry after the photodetection element detects light, and set the on-resistance to the second value by the second reset circuitry after the first reset circuitry select to set the on-resistance to the first value.

22 Claims, 14 Drawing Sheets

(56) References Cited

U.S. PATENT DOCUMENTS

| | | |
|---|---|---|
| 9,201,138 B2 | 12/2015 | Eisle et al. |
| 9,234,964 B2 | 1/2016 | Mheen et al. |
| 9,823,353 B2 | 11/2017 | Eichenholz et al. |
| 9,952,323 B2 | 4/2018 | Deane |
| 10,304,877 B2 | 5/2019 | Mellot et al. |
| 2009/0315135 A1 | 12/2009 | Finkelstein et al. |
| 2015/0285625 A1* | 10/2015 | Deane .................. G01S 7/4863 348/140 |
| 2017/0131143 A1* | 5/2017 | Andreou ........... H01L 31/02027 |
| 2018/0143324 A1 | 5/2018 | Keilaf et al. |
| 2018/0016441 A1 | 6/2018 | Gnecchi et al. |
| 2018/0164412 A1 | 6/2018 | Gnecchi et al. |
| 2018/0164413 A1 | 6/2018 | Gnecchi et al. |
| 2018/0164414 A1 | 6/2018 | Gnecchi et al. |
| 2018/0195900 A1 | 7/2018 | Delic |
| 2018/0284239 A1 | 10/2018 | Lachapelle et al. |
| 2018/0364331 A1 | 12/2018 | Yamasaki |
| 2019/0018117 A1 | 1/2019 | Perenzoni et al. |
| 2019/0113385 A1 | 4/2019 | Fukuchi |
| 2019/0129012 A1 | 5/2019 | Ikuta et al. |
| 2019/0146088 A1 | 5/2019 | Pacala et al. |
| 2019/0154815 A1 | 5/2019 | Oohata |
| 2019/0154832 A1 | 5/2019 | Maleki et al. |
| 2019/0154835 A1 | 5/2019 | Maleki et al. |
| 2019/0235061 A1 | 8/2019 | Ren et al. |
| 2020/0018832 A1 | 1/2020 | Azuma et al. |
| 2020/0182692 A1* | 6/2020 | Lilic ......................... G01J 1/44 |
| 2020/0252564 A1* | 8/2020 | Palubiak ........... H01L 27/14643 |
| 2020/0296313 A1* | 9/2020 | Nishino ................... G01C 3/06 |
| 2020/0389616 A1* | 12/2020 | Grot .................. H04N 5/37452 |

FOREIGN PATENT DOCUMENTS

| | | |
|---|---|---|
| JP | 2015-117970 A | 6/2015 |
| JP | 6285168 B2 | 2/2018 |
| JP | 2018-173379 A | 11/2018 |
| JP | 2018-179732 A | 11/2018 |
| JP | 2019-2760 A | 1/2019 |
| JP | 2019-33181 A | 2/2019 |
| JP | 6483725 B2 | 3/2019 |
| JP | 2019-52981 A | 4/2019 |
| WO | WO 2018/181979 A1 | 10/2018 |
| WO | WO 2018/190276 A1 | 10/2018 |
| WO | WO 2019/087783 A1 | 5/2019 |
| WO | WO 2020/179696 A1 | 9/2020 |

\* cited by examiner

1 : PHOTODETECTION APPARATUS

PHOTODETECTION APPARATUS, ELECTRONIC APPARATUS AND PHOTODETECTION METHOD

CROSS REFERENCE TO RELATED APPLICATIONS

This application is based upon and claims the benefit of priority from the prior Japanese Patent Application No. 2019-108851, filed on Jun. 11, 2019, the entire contents of which are incorporated herein by reference.

FIELD

Embodiments of the present disclosure relate to a photodetection apparatus, an electronic apparatus and a photodetection method.

BACKGROUND

An avalanche photodiode (hereinafter, APD) is one of photodetection elements that convert received light into an electronic signal. Especially, when the APD operates in the Geiger mode, the APD is capable of detecting a single photon. However, although the APD operating in the Geiger mode shows higher sensitivity, the operation state of the APD changes after detecting the photon, so that the APD cannot detect light at high sensitivity. For this reason, it is required to connect a quench circuit to the APD to reset the APD. The quench circuit is classified into a passive quench circuit and an active quench circuit. The passive quench circuit performs resetting by feeding a current to the APD via a resistance element connected in series to the APD. The passive quench circuit has a simple circuit configuration but has a problem of slow operation. In contrast, the active quench circuit forcibly feeds a current to the APD, using a transistor and the like, which can perform a reset operation at high speeds.

However, the conventional active quench circuit has a problem in that, when the APD detects light while feeding a current to the APD for resetting the APD, the current flowing to the APD cannot be controlled, so that the APD may generate excessive heat to be broken down. Moreover, when a large amount of current flows to the APD, the APD emits light, which results in that a current due to crosstalk flows to other APDs present in surroundings.

DETAILED DESCRIPTION

A photodetection apparatus according to one embodiment has a photodetection element, first reset circuitry configured to select whether to set on-resistance between a first voltage node and a terminal of the photodetection element to a first value, second reset circuitry configured to select whether to set the on-resistance to a second value smaller than the first value, and control circuitry configured to set the on-resistance to the first value by the first reset circuitry after the photodetection element detects light, and set the on-resistance to the second value by the second reset circuitry after the first reset circuitry select to set the on-resistance to the first value.

Hereinafter, embodiments of a photodetection apparatus and an electronic apparatus, and a distance measuring method will now be explained with reference to the accompanying drawings. In the following embodiments, a major configuration of the photodetection apparatus and the electronic apparatus will be mainly explained. However, the photodetection apparatus and the electronic apparatus may have other configurations and functions that are not shown or explained.

First Embodiment

Figure 1:
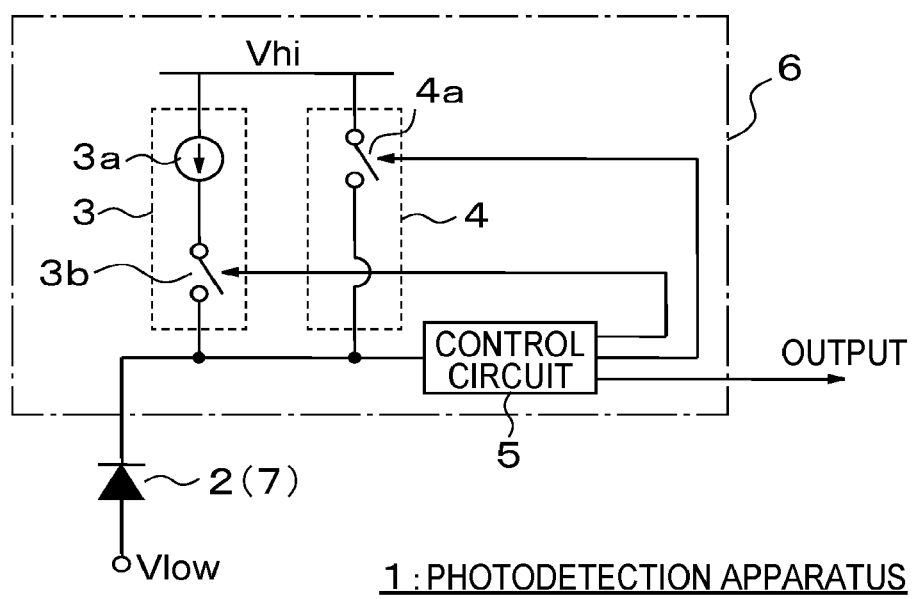
FIG. 1 is a circuit diagram of a photodetection apparatus according to a first embodiment.

FIG. 1 is a circuit diagram of a photodetection apparatus 1 according to a first embodiment. The photodetection apparatus 1 of FIG. 1 is provided with a photodetection element 2, a first reset circuit 3, a second reset circuit 4, and a control circuit 5. The first reset circuit 3, the second reset circuit 4, and the control circuit 5 configure an active quench circuit 6. The active quench circuit 6 performs a forcible reset operation to the photodetection element 2 after the photodetection element 2 detects light.

The photodetection element 2 is, for example, an APD 7. The APD 7 is applied with a reverse bias voltage higher than a breakdown voltage of the APD 7 and driven in a region referred to as the Geiger mode. The gain of APD 7 in the Geiger mode is in an extremely high order of $10^5$ to $10^6$, so that it is possible to measure extremely weak light of a single photon. Hereinbelow, an example in which the APD 7 is used as the photodetection element 2 will mainly be explained.

In the photodetection apparatus 1 of FIG. 1, a first reset circuit 3 and a second reset circuit 4 are connected in parallel between a first voltage node Vhi and a cathode of the APD 7. To an anode of the APD 7, a second voltage node Vlow is connected. The second voltage node Vlow is a voltage node lower than the first voltage node Vhi.

The first reset circuit 3 selects whether to set the on-resistance between the first voltage node Vhi and one end (a terminal such as a cathode of the APD 7) of the photodetection element 2 to a first value. The first reset circuit 3 can be configured by series-connecting a current source 3a and a first switch 3b. The current source 3a outputs a predetermined current. The current source 3a is provided to restrict the current to flow to the cathode of the APD 7. The first switch 3b selects whether to feed the current output from the current source 3a to the cathode of the APD 7. When the first switch 3b is on, the current output from the current source 3a passes through the first switch 3b to flow to the cathode of the APD 7. The on-resistance of the first reset circuit 3 is the impedance of the first reset circuit 3 when the first switch 3b is on.

The second reset circuit 4 selects whether to set the on-resistance between the first voltage node Vhi and one end (cathode of the APD 7) of the photodetection element 2 to a second value smaller than the first value. The second reset circuit 4 has a second switch 4a. When the second switch 4a is on, a current passes through the second switch 4a from the first voltage node Vhi to flow to the cathode of the APD 7. The on-resistance of the second reset circuit 4 is the impedance of the second reset circuit 4 when the second switch 4a is on. The second value that is the on-resistance of the second reset circuit 4 is smaller than the first value that is the on-resistance of the first reset circuit 3. Therefore, the current flowing to the cathode of the APD 7 from the second reset circuit 4 when the second switch 4a is on is larger than the current flowing to the cathode of the APD 7 from the first reset circuit 3 when the first switch 3b is on. In the present embodiment, a duration in which the on-resistance of the second reset circuit 4 becomes the second value is set shorter a duration in which the on-resistance of the first reset circuit 3 becomes the first value.

The control circuit 5, after the APD 7 detects light, sets the on-resistance between the first voltage node Vhi and the cathode of the APD 7 to the first value by means of the first reset circuit 3, and thereafter, sets the on-resistance to the second value by means of the second reset circuit 4. In more specifically, the control circuit 5, after the APD 7 detects light, holds the one end (cathode) of the APD 7 at a first voltage, and thereafter, sets the on-resistance to the first value by means of the first reset circuit 3, and thereafter, sets the on-resistance to the second value by means of the second reset circuit 4. As the on-resistance is smaller, the current flows more easily, by switching the on-resistance between the first voltage node Vhi and the cathode of the APD 7, the current flowing to the cathode of the APD 7 can be varied. As described above, the control circuit 5 feeds the restricted current from the first reset circuit 3 in a reset operation after the APD 7 detects light to the cathode of the APD 7, and thereafter, feeds a large current from the second reset circuit 4 to the cathode of the APD 7.

Figure 2:
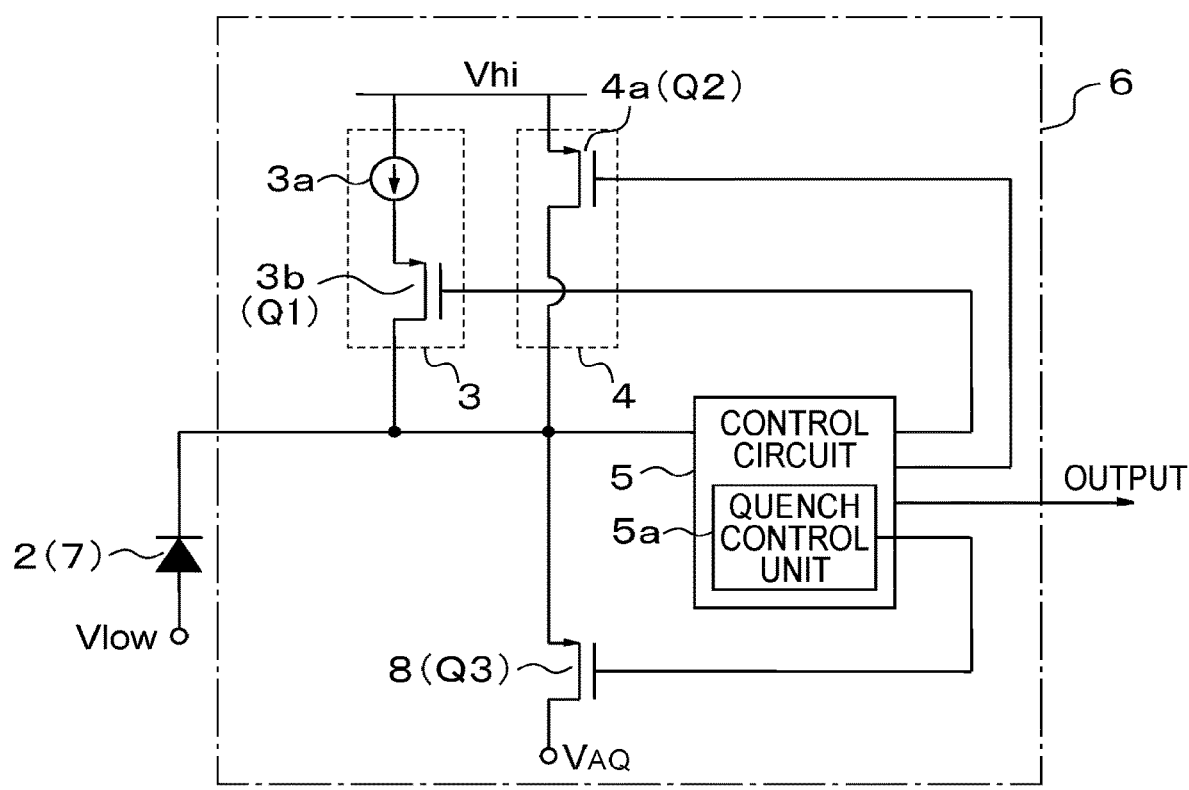
FIG. 2 is a circuit diagram showing a first modification example of the photodetection apparatus 1 of FIG. 1.

FIG. 2 is a circuit diagram showing a first modification example of the photodetection apparatus 1 of FIG. 1. The photodetection apparatus 1 of FIG. 2 has a specific configuration of each component of the photodetection apparatus 1 of FIG. 1. In the photodetection apparatus 1 of FIG. 2, the first switch 3b in the first reset circuit 3 and the second switch 4a in the second reset circuit 4 are configured with transistors Q1 and Q2, respectively. The gate voltages of the transistors Q1 and Q2 are controlled by the control circuit 5. Moreover, the control circuit 5 of FIG. 2 has a quench control unit (voltage hold circuit) 5a. Furthermore, the photodetection apparatus 1 of FIG. 2 has a third switch 8 that is turned on and off by the quench control unit 5a. In FIG. 2, an example in which the third switch 8 is configured with a MOS transistor Q3 is shown.

The quench control unit 5a, when the APD 7 detects light, holds a cathode voltage of the APD 7 at a predetermined voltage VAQ for a predetermined duration. In more specifically, the quench control unit 5a, after the APD 7 detects light, holds one end (cathode) of the APD 7 at the first voltage for a predetermined duration in response to that the one end of the APD 7 is set to the second voltage different from the first voltage. The third switch 8 is connected between the cathode of the APD 7 and a third voltage node VAQ. The third voltage node VAQ may, for example, be a ground voltage or any voltage other than the ground voltage. The quench control unit 5a turns on the third switch 8 when the cathode voltage of the APD 7 is lowered to a predetermined first threshold voltage Vth1. When the third switch 8 is turned on, the cathode voltage of the APD 7 is held at the voltage of the third voltage node VAQ.

Figure 3:
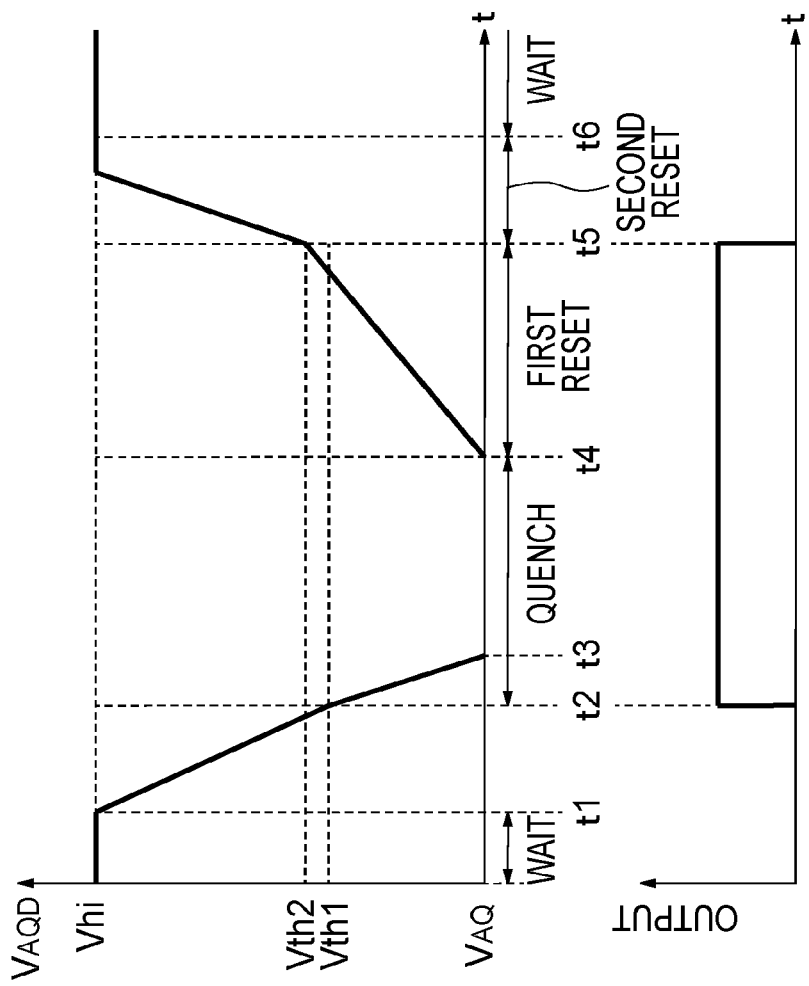
FIG. 3 is a voltage waveform chart of the photodetection apparatus 1 of FIG. 1.

FIG. 3 is a voltage waveform chart of the photodetection apparatus 1 of FIG. 1. In FIG. 3, the abscissa is time and the ordinate is voltage value. FIG. 3 shows a state before time t1 in which the PDF 7 does not detect light, during which the cathode voltage of the APD 7 is a voltage roughly equal to the voltage Vhi of the first voltage node Vhi.

When the PDF 7 detects light at time t1, electron-hole pairs are generated inside the APD 7 to cause a current to flow in the APD 7. Accordingly, the cathode voltage of the APD 7 starts to lower. When the cathode voltage of the APD 7 lowers to the predetermined first threshold voltage Vth1 (time t2), the third switch 8 is turned on, so that the cathode voltage of the APD 7 lowers to the voltage VAQ of the third voltage node (time t3).

The quench control unit 5a holds the on-state of the third switch 8 until time t4, so that the cathode voltage of the APD 7 is held at the voltage VAQ.

Figure 4A:
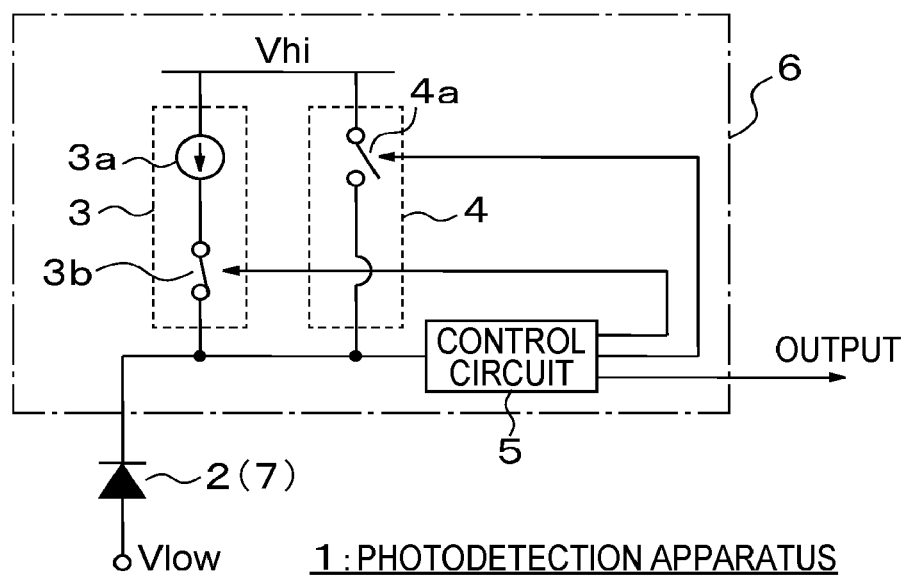
FIG. 4A is an equivalent circuit in the case where a first reset circuit turns on a first switch.

At time t4, the quench control unit 5a turns off the third switch 8 and the control circuit 5 turns on the first switch 3b in the first reset circuit 3. Accordingly, as shown in an equivalent circuit of FIG. 4A, the current from the current source 3a in the first reset circuit 3 flows to the cathode of the APD 7 via the first switch 3b, so that the cathode voltage of the APD 7 starts to gradually rise. Since the current output from the current source 3a is restricted, the current flowing to the cathode of the APD 7 from the first reset circuit 3 is also restricted, so that the cathode voltage of the APD 7 gently rises.

Figure 4B:
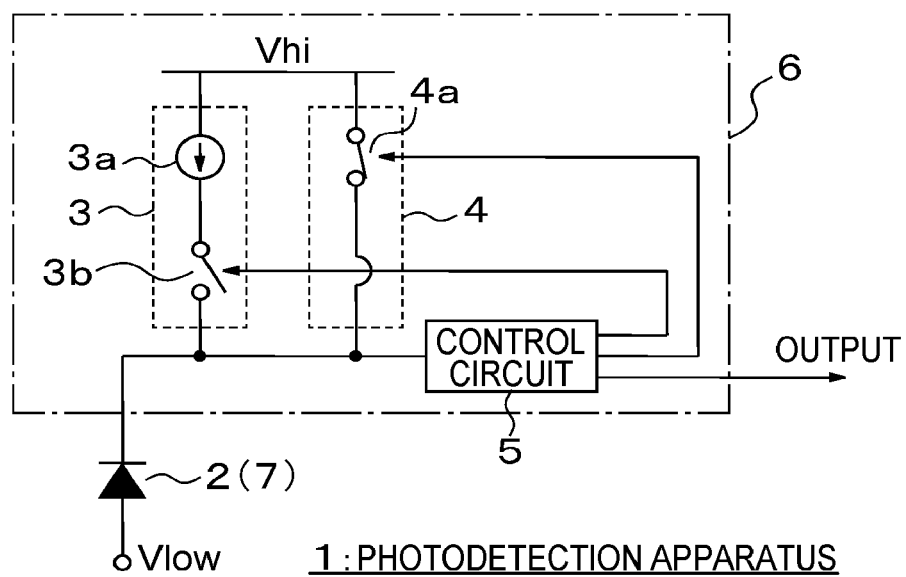
FIG. 4B is an equivalent circuit in the case where a second reset circuit turns on a second switch.

When the cathode voltage of the APD 7 reaches a predetermined second threshold voltage Vth2 Vth1) (time t5), the control circuit 5 turns off the first switch 3b in the first reset circuit 3 and turns on the second switch 4a. Accordingly, as shown in an equivalent circuit of FIG. 4B, a large current flows to the cathode of the APD 7 via the second switch 4a in the second reset circuit 4. Therefore, the cathode voltage of the APD 7 rapidly rises to reach a saturation voltage at time t6. As shown in FIG. 3, the control circuit 5 outputs a pulse signal having a pulse width from time t2 to time t5.

In the present embodiment, the duration in which the first reset circuit 3 turns on the first switch 3b is referred to as first reset and the duration in which the second reset circuit 4 turns on the second switch 4a is referred to as second reset.

Figure 5:
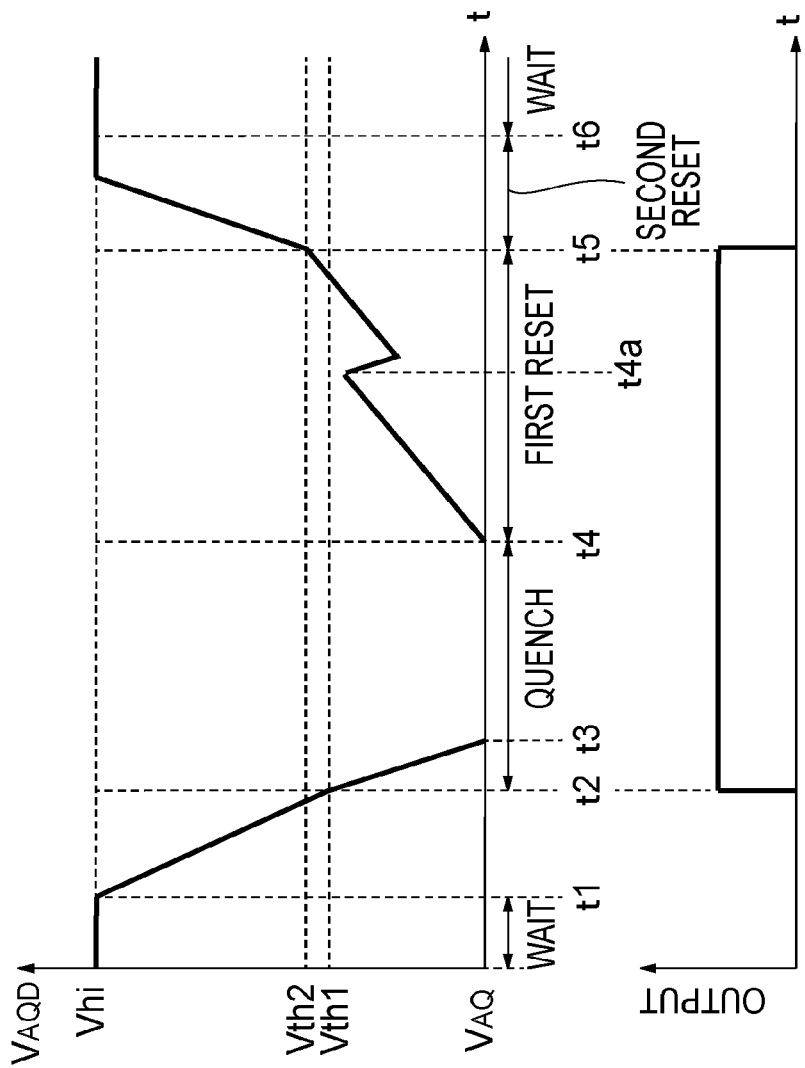
FIG. 5 is a voltage waveform chart in the case where an APD detects light while a current is flowing from the first reset circuit to a cathode of the APD.

There may be a case in which the APD 7 detects light during a first reset duration during which a current is flowing from the first reset circuit 3 to the cathode of the APD 7. The voltage waveform chart in this case is such as shown in FIG. 5. The period from time t4 to time t5 in FIG. 5 is the first reset duration during which a current is flowing from the first reset circuit 3 to the cathode of the APD 7. When the APD 7 detects light in this duration, electron-hole pairs are generated in the APD 7 to cause a current to flow in the APD 7, so that the cathode voltage of the APD 7 lowers (time t4a). However, since the current flowing through the first reset circuit 3 is restricted by the current source 3a, there is no possibility of rapid increase in the current flowing through the APD 7. When the APD 7 does not detect light, the current from the first reset circuit 3 flows to the cathode of the APD 7, so that the cathode voltage of the APD 7 starts to rise again. When the cathode voltage of the APD 7 reaches the predetermined second threshold voltage Vth2, the control circuit 5 turns off the first switch 3b in the first reset circuit 3 and turns on the second switch 4a in the second reset circuit 4. Accordingly, a large current from the second reset circuit 4 flows to the cathode of the APD 7, so that the cathode voltage of the APD 7 rapidly rises.

Figure 6:
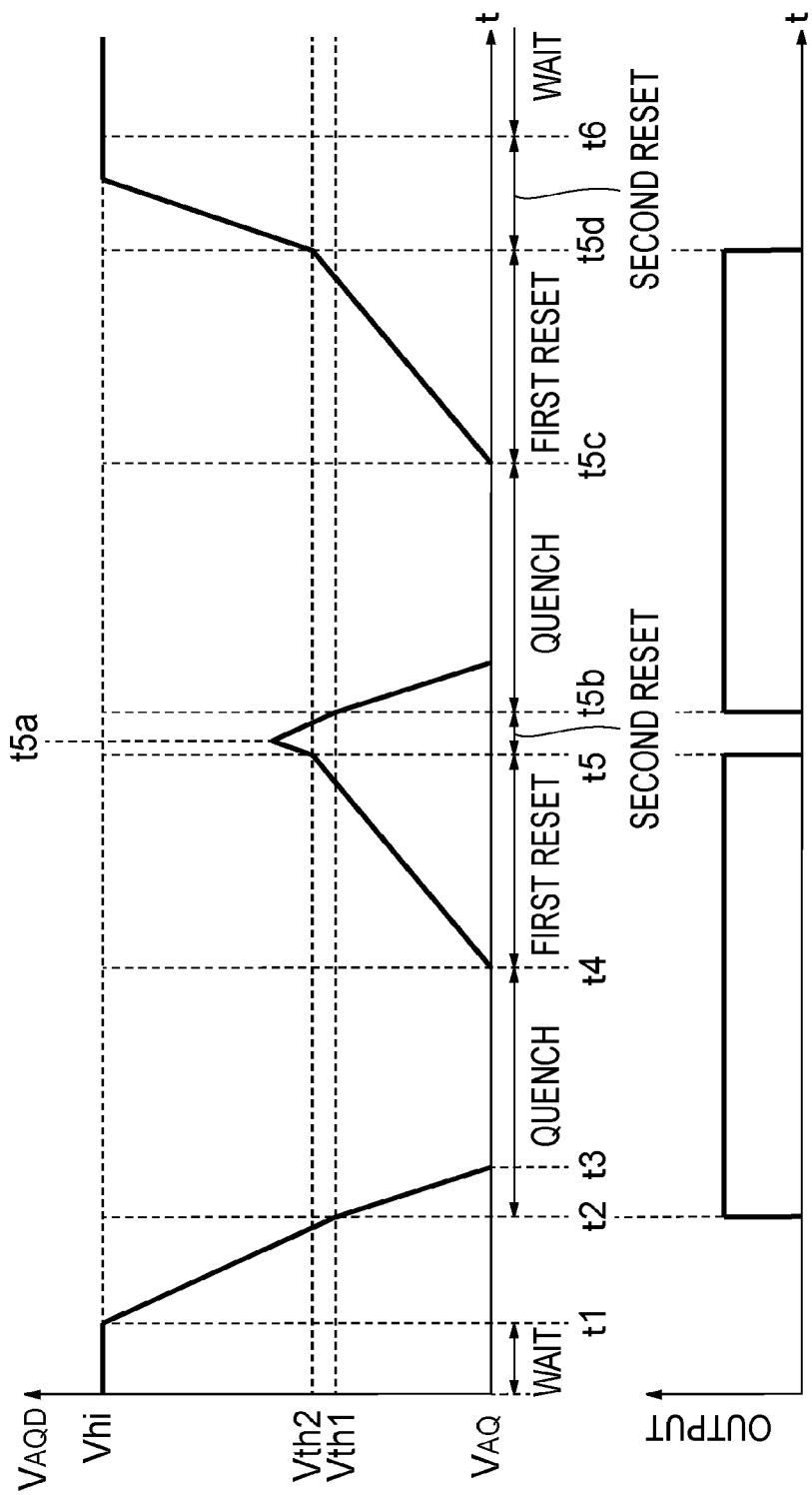
FIG. 6 is a voltage waveform chart in the case where the APD detects light while a current is flowing from the second reset circuit to the cathode of the APD.

Moreover, there may be a case in which the APD 7 detects light during a second reset duration during which a large current is flowing from the second reset circuit 4 to the cathode of the APD 7. The voltage waveform chart in this case is such as shown in FIG. 6. At time t5 in FIG. 6, the second switch 4a in the second reset circuit 4 turns on, so that a large current starts to flow from the second reset circuit 4 to the anode of the APD 7. When the APD 7 detects light at time t5 in this state, electron-hole pairs are generated in the APD 7 to cause a current to flow in the APD 7, so that the cathode voltage of the APD 7 starts to lower. However, when the cathode voltage of the APD 7 lowers to the predetermined first threshold voltage Vth1 (time t5b), the quench control unit 5a turns on the third switch 8, so that the cathode voltage of the APD 7 is held at the predetermined voltage VAQ during a predetermined duration (time t5b to t5c). Thereafter, at time t5c, the first switch 3b in the first reset circuit 3 turns on, and then at time t5d, the second switch 4a in the second reset circuit 4 turns on.

As described above, when the APD 7 detects light during the duration in which a large current flows from the second reset circuit 4 to the cathode of the APD 7, the quench control unit 5a turns on at a moment at which the cathode voltage of the APD 7 lowers to a predetermined threshold voltage. Therefore, there is no possibility of flow of an uncontrollable large current to the APD 7, so that the APD 7 can be protected from breakdown due to generation of heat and crosstalk due to light emission of the APD 7 can be reduced.

The cathode voltage of the APD 7 in the state where the APD 7 does not detect light is considerably higher than the gate voltage of the MOS transistor that configures the first switch 3b and the second switch 4a. Therefore, voltage level conversion may be required in the case where the control circuit 5 controls the gate voltage of the MOS transistor for the first switch 3b and the second switch 4a based on the cathode voltage of the APD 7.

Figure 7:
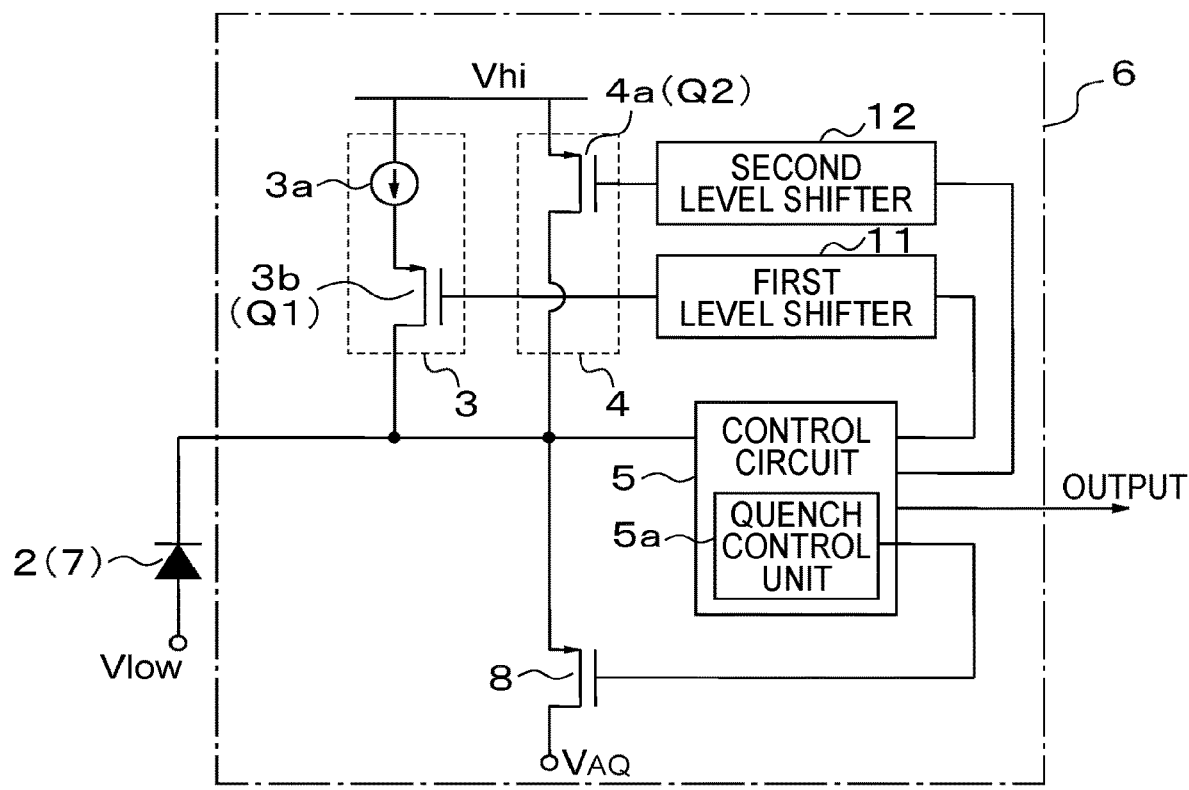
FIG. 7 is a circuit diagram in which a first level shifter and a second level shifter are added to the photodetection apparatus 1 of FIG. 2.

FIG. 7 is a circuit diagram in which a first level shifter 11 and a second level shifter 12 are added to the photodetection apparatus 1 of FIG. 2. A control signal for the first switch 3b output from the control circuit 5 is input to the gate of the MOS transistor Q1 via the first level shifter 11. Likewise, a control signal for the second switch 4a output from the control circuit 5 is input to the gate of the MOS transistor Q2 via the second level shifter 12. The first level shifter 11 and the second level shifter 12 perform voltage control to lower the voltage from a voltage level of the cathode voltage of the APD 7 to a voltage level of the gates of the MOS transistors Q1 and Q2.

The photodetection apparatuses 1 of FIGS. 1, 2 and 7 indicate the minimum configuration for light detection. Actually, the photodetection apparatuses 1 of FIGS. 1, 2 and 7 are often used in a state where a plural number of the photodetection apparatuses 1 are arranged in a one-dimensional direction or a two-dimensional direction. Moreover, a semiconductor IC in which a plural number of the photodetection apparatuses 1 of FIGS. 1, 2 and 7 are integrated may be fabricated.

Figure 8:
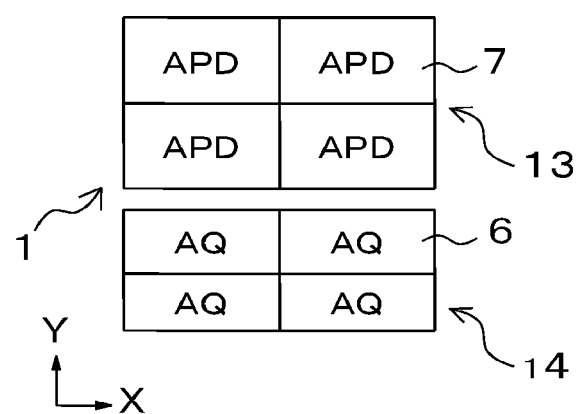
FIG. 8 is a schematic layout chart of a photodetection apparatus provided with four APDs and four active quench circuits.

FIG. 8 is a schematic layout chart of a photodetection apparatus 1 provided with four APDs 7 and four active quench circuits (denoted with AQ in the chart) 6. The active quench circuit 6 is a circuit that includes the first reset circuit 3, the second reset circuit 4, and the control circuit 5 in the photodetection apparatuses 1 of FIGS. 1, 2 and 7.

In FIG. 8, four APDs 7 configure one SiPM (Silicon Photomultiplier) 13, and four active quench circuits 6 configure an active quench circuit group 14. In FIG. 8, two active quench circuits 6 are arranged in an X-direction and also in a Y-direction, adjacent to the SiPM 13 having two APDs 7 arranged in the X-direction and also in the Y-direction. However, any number of APDs 7 in the SiPM 13 can be arranged in any way, and also the SiPM 13 and the active quench circuits 6 can be arranged in any positional relationship.

Figure 9:
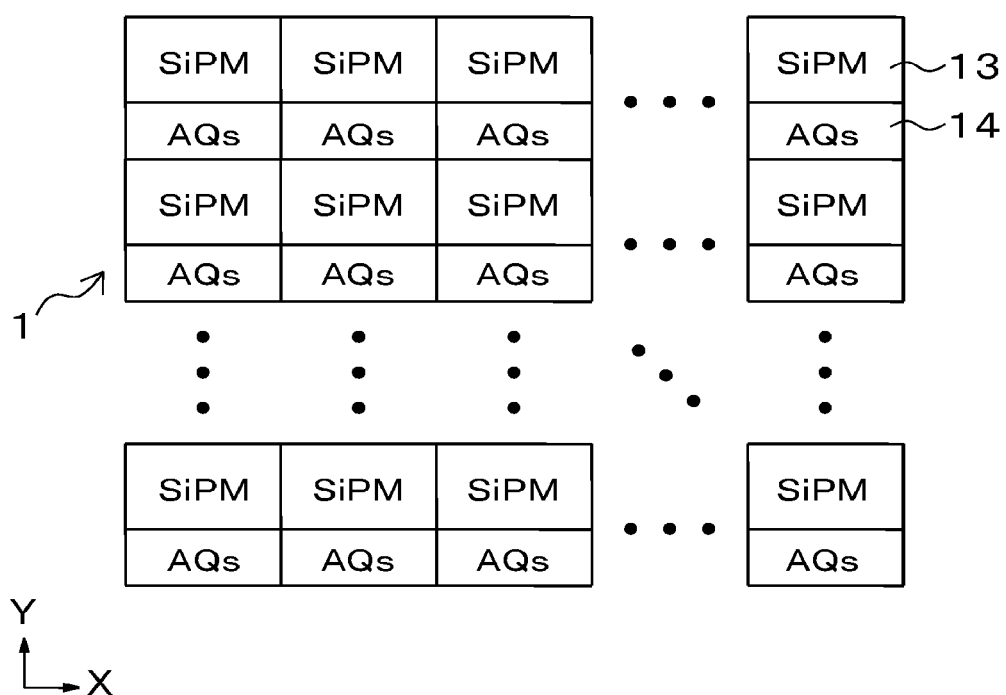
FIG. 9 is a layout chart of a plurality of SiPMs and active quench circuits arranged on a semiconductor substrate.

Actually, a plural number of SiPMs 13 and active quench circuits 6 such as those in FIG. 8 are arranged on a semiconductor substrate to be fabricated in one chip. FIG. 9 is a layout chart of a plurality of SiPMs 13 and active quench circuit groups (APDs) 14 arranged on a semiconductor substrate. As shown, a plurality of groups each having an SiPM 13 and an active quench circuit group 14 are arranged in the X- and Y-directions.

Figure 10A:
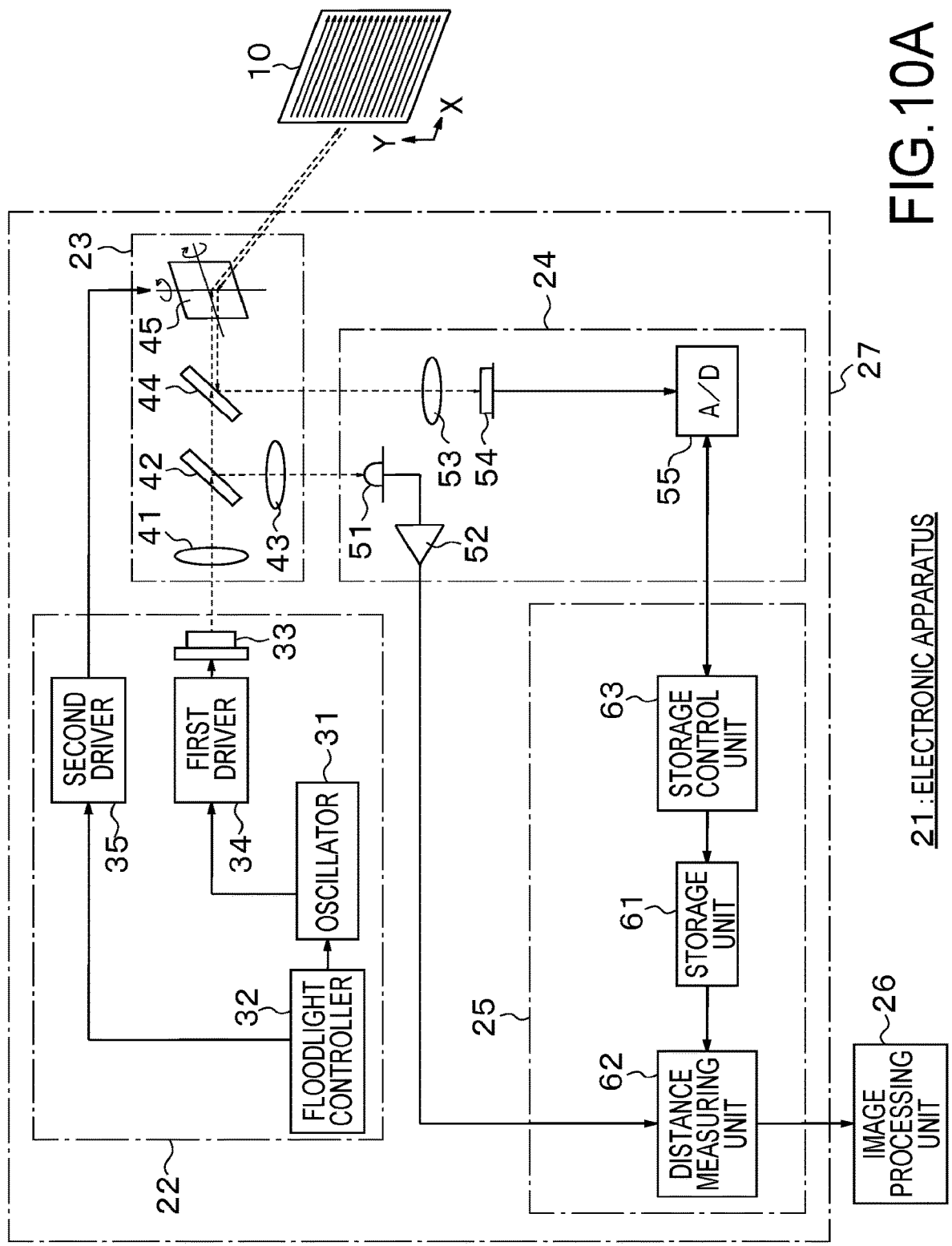
FIG. 10A is a block diagram schematically showing the configuration of an electronic apparatus provided with a light receiving unit implemented with the photodetection apparatus according to the present embodiment.

The photodetection apparatus 1 according to the present embodiment can be implemented in an electronic apparatus for performing ToF (Time of Flight)-type distance measurement. FIG. 10A is a block diagram schematically showing the configuration of an electronic apparatus 21 provided with a light receiving unit (light detector) 24 implemented with the photodetection apparatus 1 according to the present embodiment. The electronic apparatus 21 of FIG. 10A is provided with a floodlight unit 22, a light controlling unit 23, a light receiving unit 24, a signal processing unit 25, and an image processing unit 26. Among them, the floodlight unit 22, the light controlling unit 23, the light receiving unit 24, and the signal processing unit 25 configure a distance measuring device 27. At least part of the electronic apparatus 21 of FIG. 10A can be configured with one or plurality of semiconductor ICs (Integrated Circuits). For example, the signal processing unit 25 and the image processing unit 26 may be integrated into one semiconductor chip or the light receiving unit 24 may also be integrated into this semiconductor chip. Moreover, the floodlight unit 22 may also be integrated into this semiconductor chip.

The floodlight unit 22 emits first light as floodlight. The first light is, for example, a laser beam in a predetermined frequency band. The laser beam is coherent light with constant phase and frequency. The floodlight unit 22 emits pulsed first light intermittently in a predetermined cycle. The cycle in which the floodlight unit 22 emits the first light as floodlight is a period of time equal to or longer than the time required for the distance measuring apparatus 27 to measure a distance on a basis of one pulse of the first light.

The floodlight unit 22 has an oscillator 31, a floodlight controller 32, a light source 33, a first driver 34, and a second driver 35. The oscillator 31 generates an oscillation signal in accordance with the cycle of emitting the first light as flood light. The first driver 34 intermittently supplies power to the light source 33 in synchronism with the oscillation signal. The light source 33 intermittently emits the first light on a basis of the power from the first driver 34. The light source 33 may be a laser element that emits a single laser beam or a laser unit that emits a plurality of laser beams. The floodlight controller 32 controls the second driver 35 in synchronism with the oscillation signal. The second driver 35 supplies a drive signal to the light controller 23 in synchronism with the oscillation signal in response to a command from the floodlight controller 32.

The light controller 23 controls the travel direction of the first light emitted from the light source 33. Moreover, the light controller 23 controls the travel direction of received second light.

The light controller 23 has a first lens 41, a beam splitter 42, a second lens 43, a half mirror 44, and a scanning mirror 45.

The first lens 41 collects the first light emitted from the floodlight unit 22 and guides it to the beam splitter 42. The beam splitter 42 divides the first light from the first lens 41 in two directions and guides them to the second lens 43 and the half mirror 44 separately. The second lens 43 guides the divided light from the beam splitter 42 to the light receiving unit 24. The reason for guiding the first light to the light receiving unit 24 is that the light receiving unit 24 detects a floodlighting timing.

The half mirror 44 passes the divided light from the beam splitter 42 to guide it to the scanning mirror 45. Moreover, the half mirror 44 reflects second light including reflected light incident on the electronic apparatus 21 to the direction of the light receiving unit 24.

The scanning mirror 45 rotates the mirror surface in synchronism with a drive signal from the second driver 35 in the floodlight unit 22. In this way, the scanning mirror 45 controls the reflection direction of the divided light (first light) incident on the mirror surface of the scanning mirror 45 after passing through the half mirror 44. By controlling the rotation of the mirror surface of the half mirror 44 at a constant cycle, it is possible to scan the first light emitted from the light controller 23 at least in a one-dimensional direction. By providing two shafts in two directions for rotating the mirror surface, it is also possible to scan the first light emitted from the light controller 23 in a two-dimensional direction. FIG. 10A shows an example of scanning the first light emitted from the electronic apparatus 21 as floodlight in an X-direction and a Y-direction by means of the scanning mirror 45.

In the case where an object 10, such as a human or a body, is present in a scanning range of the first light emitted from the electronic apparatus 21 as floodlight, the first light is reflected by the object 10. At least part of the reflected light reflected by the object 10 propagates in the reverse direction through the passage almost the same as that of the first light and is incident on the scanning mirror 45 in the light controller 23. Although the mirror surface of the scanning mirror 45 is being rotated at a predetermined cycle, since a laser beam propagates at the speed of light, the reflected light from the object 10 is incident on the mirror surface while there is almost no change in the angle of the mirror surface of the scanning mirror 45. The reflected light from the object 10 incident on the mirror surface is reflected by the half mirror 44 and received by the light receiving unit 24.

The light receiving unit 24 has a light detector 51, an amplifier 52, a third lens 53, a photosensor 54, and an A/D converter 55. The light detector 51 receives light divided by the beam splitter 42 and converts it to an electronic signal. The light detector 51 can detect the floodlighting timing of the first light. The amplifier 51 amplifies the electronic signal output from the light detector 51.

The third lens 53 forms an image of the light reflected by the half mirror 44 on the photosensor 54. The photosensor 54 receives the second light and converts it to an electronic signal. The photosensor 54 has the above-described SiPM (Silicon Photomultiplier) 13.

The A/D converter 55 samples the electronic signal output from the photosensor 54 at a predetermined sampling rate for A/D conversion to generate a digital signal.

The signal processing unit 25 measures the distance to the object 10 that reflected the first light and stores a digital signal in accordance with the second light in a storage unit (memory) 61. The signal processing unit 25 has the storage unit 61, a distance measuring unit 62, and a storage control unit 63.

The distance measuring unit 62 measures a distance to the object 10 based on the first light and reflected light. In more specifically, the distance measuring unit 62 measures a distance to the object 10 based on the time difference between a floodlighting timing of the first light and a reception timing of reflected light included in the second light received by the photosensor 54. In other words, the distance measuring unit 62 measures the distance based on the following expression (1). The processing operation of the distance measuring unit can be executed by a processor, processing circuitry etc.

$$\text{Distance} = \text{speed of light} \times (\text{reception timing of reflected light} - \text{floodlighting timing of first light}) \quad (1)$$

The "reception timing of reflected light" in the expression (1) is a reception timing of reflected light at a peak position, more accurately. The distance measuring unit 62 detects the peak position of the reflected light included in the second light based on a digital signal generated by the A/D converter 55.

Figure 10B:
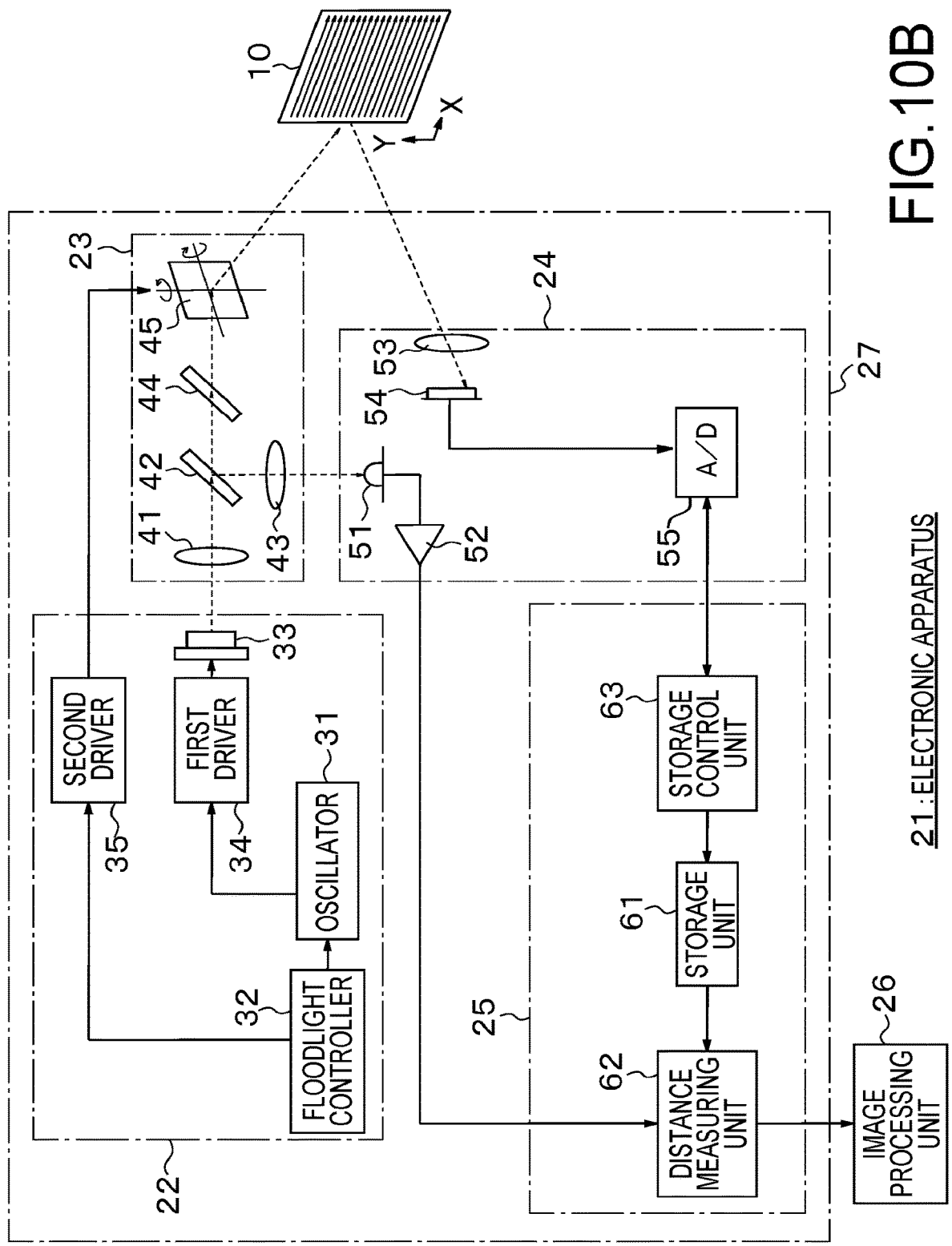
FIG. 10B is a block diagram schematically showing the configuration of a modification example of the electronic apparatus of FIG. 10A.

The electronic apparatus 21 of FIG. 10A shows an example in which the reflected light from the object 10 is reflected by the scanning mirror 45 and the half mirror 44 to be guided to the light receiving unit 24. When the photosensor 54 having a plurality of SiPMs 13 arranged in the two-dimensional direction such as shown in FIG. 9 is used, it can be applied to an electronic apparatus 21 such as shown in FIG. 10B. In the electronic apparatus 21 of FIG. 10B, the reflected light from the object 10 is, not guided to the light receiving unit 24 after reflected by the scanning mirror 45 and the half mirror 44, but directly guided to the photosensor 54 via the third lens 53.

Figure 11:
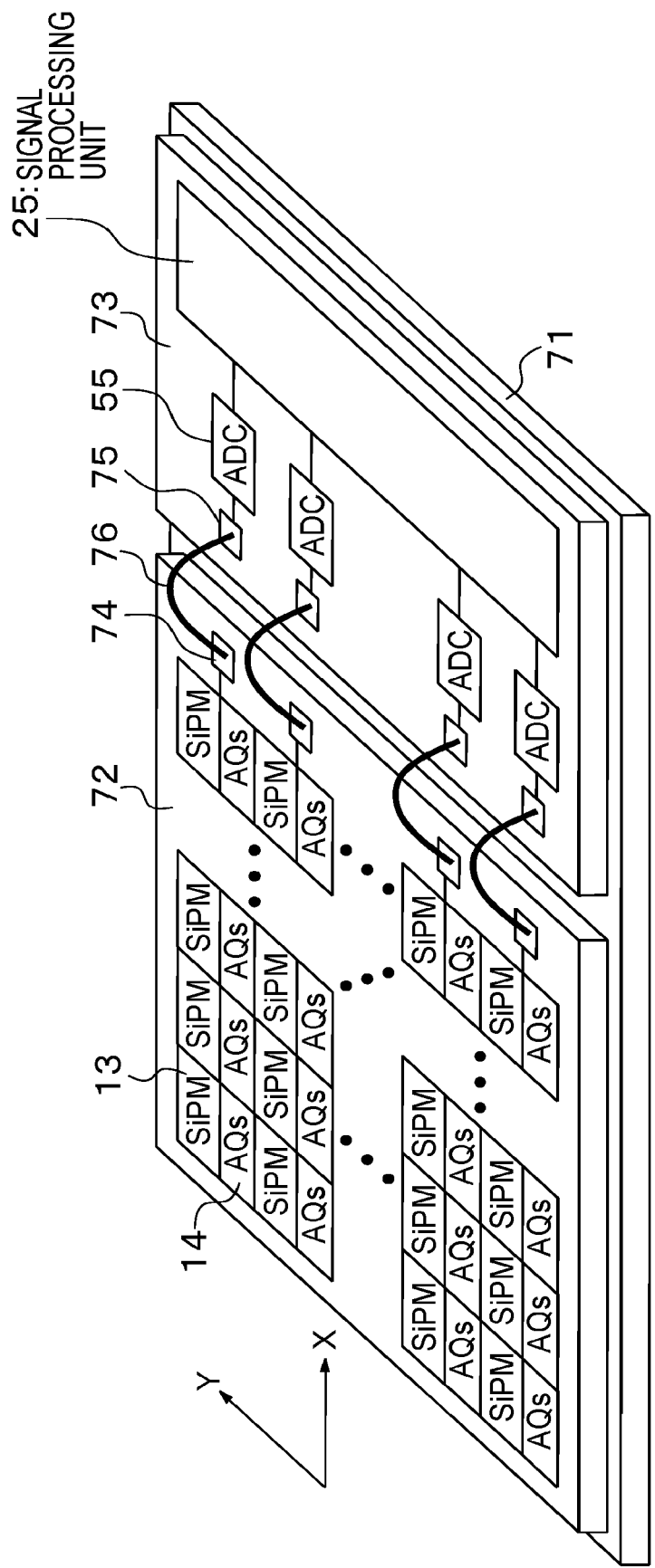
FIG. 11 is a schematic sectional view showing an example in which a light receiving unit and a signal processing unit in the electronic apparatus 21 of FIG. 10A or 10B are arranged on one semiconductor substrate.

At least part of the electronic apparatus 21 of FIG. 10A or 10B can be configured with one or a plurality of semiconductor ICs. FIG. 11 is a schematic sectional view showing an example in which the light receiving unit 24 and the signal processing unit 25 in the electronic apparatus 21 of FIG. 10A or 10B are arranged on one semiconductor substrate 71. On the semiconductor substrate 71 of FIG. 11, a first die 72 and a second die 73 are provided. On the first die 72, the photosensor 54 in the light receiving unit 24 of FIG. 10A or 10B is disposed. The photosensor 54 is, as shown in FIG. 8, provided with a plurality of SiPMs 13 and active quench circuit groups 14 arranged in the X- and Y-directions. On the second die 73, the A/D converter (ADC) 55 in the light receiving unit 24 and the signal processing unit 25, in FIG. 10A or 10B, are arranged. Pads 74 on the first die 72 and pads 75 on the second die 73 are connected by bonding wires 76.

The floodlight unit 22, the light controlling unit 23, etc., may be built on the semiconductor substrate 71 of FIG. 11. Or, the floodlight unit 22, the light controlling unit 23, etc., may be built on another substrate separately from the semiconductor substrate 71 of FIG. 11.

As described above, in the first embodiment, after the APD 7 detects light, the first reset circuit 3 restricts the current to be fed to the cathode of the APD 7 to gently raise the cathode voltage of the APD 7, and thereafter, the second reset circuit 4 feeds a large current to the cathode of the APD 7 to rapidly raise the cathode voltage of the APD 7. Accordingly, even when the APD 7 detects light while the first reset circuit 3 or the second reset circuit 4 is feeding a current to the cathode of the APD 7, it is possible to prevent the flow of an uncontrollable large current to the APD 7. Therefore, according to the present embodiment, the APD 7 can be protected from generation of heat and breakdown in a reset operation, and crosstalk due to light emission of the APD 7 can be reduced.

Second Embodiment

The photodetection apparatus 1 according to the first embodiment shows an example in which the first reset circuit 3 and the second reset circuit 4 are connected in parallel between the first voltage node Vhi and the cathode of the APD 7. However, the connection relationship among the APD 7, the first reset circuit 3, and the second reset circuit 4 can be reversed.

Figure 12:
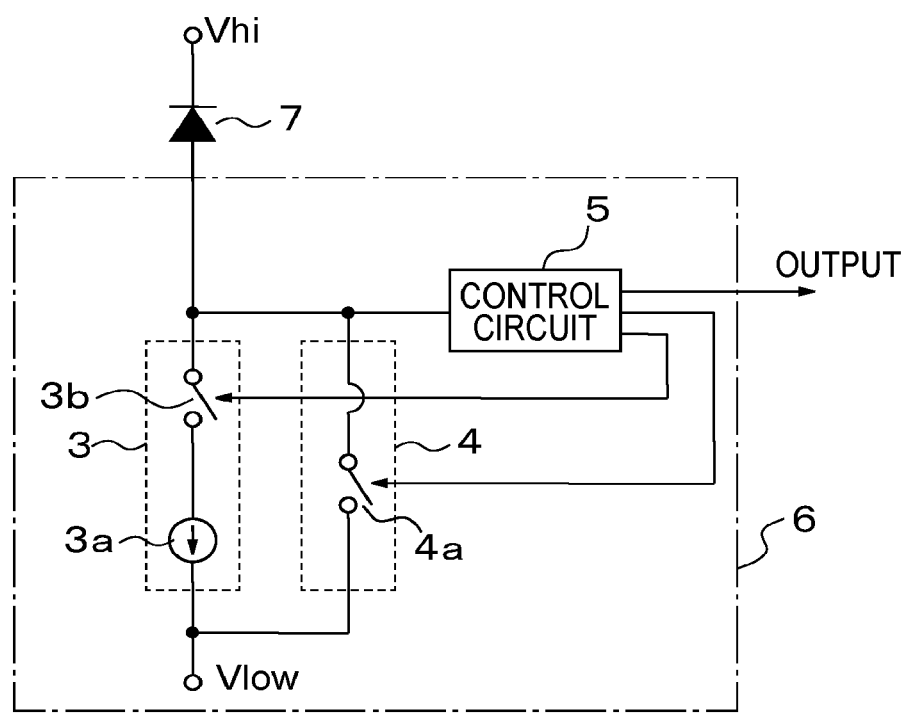
FIG. 12 is a circuit diagram of a photodetection apparatus according to a second embodiment.

FIG. 12 is a circuit diagram of a photodetection apparatus 1 according to a second embodiment. In the photodetection apparatus 1 of FIG. 12, the cathode of the APD 7 is connected to the first voltage node Vhi, and the first reset circuit 3 and the second reset circuit 4 are connected in parallel between the anode of the APD 7 and the second voltage node Vlow. The control circuit 5 controls the switching of the first switch 3b in the first reset circuit 3 and the second switch 4a in the second reset circuit 4 based on the anode voltage of the APD 7.

The change in anode voltage waveform of the APD 7 is in the reverse of that shown in FIG. 3. When APD 7 detects light, the anode voltage of the APD 7 gradually rises. When the anode voltage of the APD 7 reaches a predetermined threshold voltage, the control circuit 5 turns on the first switch 3b in the first reset circuit 3 to pass a current from the anode of the APD 7 through the current source 3a in the first reset circuit 3 and feed the current to the second voltage node Vlow. Accordingly, the anode voltage of the APD 7 gradually lowers. Thereafter, the control circuit 5 turns on the second switch 4a in the second reset circuit 4. Accordingly, the current flowing to the anode of the APD 7 rapidly increases, so that the anode voltage of the APD 7 rapidly lowers.

In the photodetection apparatus 1 of FIG. 12, there is no possibility of unlimited current flow to the APD 7 even when the APD 7 detects light while the current from the anode of the APD 7 is flowing to the current source 3a in the first reset circuit 3 or while the current from the anode of the APD 7 is flowing to the second switch 4a in the second reset circuit 4. Therefore, like the first embodiment, generation of heat and crosstalk of the APD 7 can be reduced.

Also in the photodetection apparatus 1 according to the second embodiment, a quench control unit 5a such as shown in FIG. 2 can be provided in the control circuit 5. Moreover, also in the photodetection apparatus 1 according to the second embodiment, a first level shifter 11 and a second level shifter 12 such as shown in FIG. 7 can be provided.

The photodetection apparatus 1 of FIG. 12 can be used to configure the above-described SiPMs 13 and active quench circuit groups 14 such as shown in FIG. 9. Moreover, the photodetection apparatus 1 of FIG. 12 can be used to configure the electronic apparatus 21 such as shown in FIG. 10A or 10B and FIG. 11.

As described above, in the photodetection apparatus 1 according to the second embodiment, the connection relationship among the APD 7, the first reset circuit 3, and the second reset circuit 4 is in the reverse of that in the photodetection apparatus 1 according to the first embodiment. However, in the second embodiment, like the first embodiment, even when APD 7 detects light while the first reset circuit 3 or the second reset circuit 4 is feeding a current to the cathode of the APD 7, flow of an uncontrollable large current to the APD 7 can be prevented. Therefore, according to the present embodiment, the APD 7 can be protected from generation of heat and breakdown in a reset operation, and crosstalk due to light emission of the APD 7 can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A photodetection apparatus, comprising:
   a photodetection element;
   first reset circuitry configured to select whether to set on-resistance between a first voltage node and a terminal of the photodetection element to a first value;
   second reset circuitry configured to select whether to set the on-resistance to a second value smaller than the first value; and
   control circuitry configured to:
   set the on-resistance to the first value by the first reset circuitry after the photodetection element detects light; and
   set the on-resistance to the second value by the second reset circuitry after the first reset circuitry sets the on-resistance to the first value.

2. The photodetection apparatus of claim 1, wherein the control circuitry is further configured to:
   set the on-resistance to the first value by the first reset circuitry after the photodetection element detects light; and
   set the on-resistance to the second value by the second reset circuitry based on a voltage at the terminal of the photodetection apparatus.

3. The photodetection apparatus of claim 1, wherein the control circuitry is further configured to hold the terminal of the photodetection element at a first voltage after the photodetection element detects light, set the on-resistance to the first value by the first reset circuitry after holding the terminal of the photodetection element at the first voltage, and set the on-resistance to the second value by the second reset circuitry after the first reset circuitry sets the on-resistance to the first value.

4. The photodetection apparatus of claim 3, wherein the control circuitry comprises voltage hold circuitry to hold the terminal of the photodetection element at the first voltage for a predetermined duration, and then the terminal of the photodetection element is set at a second voltage different from the first voltage after the photodetection element detects light.

5. The photodetection apparatus of claim 1, wherein the first reset circuitry comprises:
   a current source to output a predetermined current; and
   a first switch to select whether to feed the predetermined current from the current source to the terminal of the photodetection element, and
   the second reset circuitry comprises;
      a second switch to select whether to connect the first voltage node and the terminal of the photodetection element.

6. The photodetection apparatus of claim 5, wherein the control circuitry is further configured to switch the first switch to feed the predetermined current from the current source to the terminal of the photodetection element when the photodetection element detects light, so that a voltage at the terminal of the photodetection element varies by a predetermined voltage, and switch the second switch to connect the first voltage node and the terminal of the photodetection element after feeding the predetermined current from the current source to the terminal of the photodetection element.

7. The photodetection apparatus of claim 5, wherein,
   the first switch is a first transistor to select whether to feed the predetermined current from the current source to the terminal of the photodetection element;
   the second switch is a second transistor to select whether to make conductive between the first voltage node and the terminal of the photodetection element;
   the control circuitry is further configured to output a first control signal to control a gate voltage of the first transistor and a second control signal to control a gate voltage of the second transistor, and
   the photodetection apparatus further comprises:
      a first level shifter to convert a voltage level of the first control signal and input the converted first control signal to a gate of the first transistor; and
      a second level shifter to convert a voltage level of the second control signal and input the converted second control signal to a gate of the second transistor.

8. The photodetection apparatus of claim 5, wherein the control circuitry is further configured to continuously switch the first switch to feed the predetermined current from the current source to the terminal of the photodetection element when the photodetection element detects light, while the first reset circuitry is setting the on-resistance to the first value.

9. The photodetection apparatus of claim 5, wherein the control circuitry is further configured to set the terminal of the photodetection element at a first voltage at a moment at which a voltage of the terminal of the photodetection element reaches a predetermined voltage or lower, when the photodetection element detects light while the second reset circuitry is setting the on-resistance to the second value, set the on-resistance to the first value by the first reset circuitry after setting the terminal of the photodetection element at the first voltage, and set the on-resistance to the second value by the second reset circuitry after setting the on-resistance to the first value.

10. The photodetection apparatus of claim 1, wherein the photodetection element is an avalanche photodiode, and
   the first reset circuitry and the second reset circuitry are connected in parallel between the first voltage node and a cathode of the avalanche photodiode.

11. The photodetection apparatus of claim 10, further comprising:
   a plurality of avalanche photodiodes arranged in a one-dimensional direction or a two-dimensional direction; and
   active quench circuitry disposed corresponding to each of the avalanche photodiodes, the active quench circuitry comprising the first reset circuitry, the second reset circuitry, and the control circuitry.

12. The photodetection apparatus of claim 1, wherein the photodetection element is an avalanche photodiode, and
   the first reset circuitry and the second reset circuitry are connected in parallel between an anode of the avalanche photodiode and the first voltage node lower in voltage level than the anode.

13. The photodetection apparatus of claim 1, wherein after the photodetection element detects light, until when one end of the photodetection element is restored to a first voltage, the first reset circuitry sets the on-resistance to the first value, and the second reset circuitry sets the on-resistance to the second value.

14. The photodetection apparatus of claim 1, wherein
   the terminal of the photodetection element has a first voltage when the photodetection element does not detect light, which lowers to a second voltage when the photodetection element detects light,
   the first reset circuitry is configured to set the on-resistance to the first value when the terminal of the photodetection element has the second voltage, and
   the second reset circuitry is configured to set the on-resistance to the second value when the terminal of the photodetection element has a third voltage between the first voltage and the second voltage.

15. An electronic apparatus comprising:
   a light detector, comprising a photodetection apparatus, and configured to receive second light including reflected light obtained by reflecting first light at an object;
   an A/D converter to generate a digital signal corresponding to the second light;
   a memory to store the digital signal; and
   processing circuitry configured to measure a distance to the object based on a floodlighting timing of the first light and a light reception timing of the reflected light at the light detector,
   wherein the photodetection apparatus includes
      a photodetection element;
      first reset circuitry configured to select whether to set on-resistance between a first voltage node and a terminal of the photodetection element to a first value;
      second reset circuitry configured to select whether to set the on-resistance to a second value smaller than the first value; and
      control circuitry configured to:
         set the on-resistance to the first value by the first reset circuitry after the photodetection element detects light; and
         set the on-resistance to the second value by the second reset circuitry after the first reset circuitry sets the on-resistance to the first value.

16. The electronic apparatus of claim 15 further comprising floodlight circuitry to emit the first light as floodlight,
wherein the processing circuitry is further configured to acquire the floodlighting timing of the first light.

17. The electronic apparatus of claim 15, wherein the control circuitry is further configured to:
set the on-resistance to the first value by the first reset circuitry after the photodetection element detects light; and
set the on-resistance to the second value by the second reset circuitry based on a voltage at the terminal of the photodetection apparatus.

18. The electronic apparatus of claim 15, wherein the control circuitry is further configured to hold the terminal of the photodetection element at a first voltage after the photodetection element detects light, set the on-resistance to the first value by the first reset circuitry after holding the terminal of the photodetection element at the first voltage, and set the on-resistance to the second value by the second reset circuitry after the first reset circuitry sets the on-resistance to the first value.

19. The electronic apparatus of claim 18, wherein the control circuitry comprises voltage hold circuitry to hold the terminal of the photodetection element at the first voltage for a predetermined duration, and then the terminal of the photodetection element is set at a second voltage different from the first voltage after the photodetection element detects light.

20. The electronic apparatus of claim 15, wherein the first reset circuitry comprises:
a current source to output a predetermined current; and
a first switch to select whether to feed the predetermined current from the current source to the terminal of the photodetection element, and
the second reset circuitry comprises:
a second switch to select whether to connect the first voltage node and the terminal of the photodetection element.

21. The electronic apparatus of claim 20, wherein the control circuitry is further con to switch the first switch to feed the predetermined current from the current source to the terminal of the photodetection element when the photodetection element detects light, so that a voltage at the terminal of the photodetection element varies by a predetermined voltage, and switch the second switch to connect the first voltage node and the terminal of the photodetection element after feeding the predetermined current from the current source to the terminal of the photodetection element.

22. A photodetection apparatus, comprising:
a photodetection element;
first reset circuitry that is connected between a first voltage node and a terminal of the photodetection element, and applies a first current to the terminal of the photodetection element;
second reset circuitry that is connected in parallel to the first reset circuitry, and applies a second current larger than the first current to the terminal of the photodetection element; and
control circuitry that applies the first current to the terminal of the photodetection element by the first reset circuitry after the photodetection element detects light, and then applies the second current to the terminal of the photodetection element by the second reset circuitry.

* * * * *